United States Patent [19]
McLaury

[11] Patent Number: 6,130,856
[45] Date of Patent: *Oct. 10, 2000

[54] METHOD AND APPARATUS FOR MULTIPLE LATENCY SYNCHRONOUS DYNAMIC RANDOM ACCESS MEMORY

[75] Inventor: Loren L. McLaury, Boise, Id.

[73] Assignee: Micron Technology, Inc., Boise, Id.

[ * ] Notice: This patent is subject to a terminal disclaimer.

[21] Appl. No.: 09/149,707

[22] Filed: Sep. 8, 1998

Related U.S. Application Data

[60] Continuation of application No. 08/783,922, Jan. 17, 1997, Pat. No. 5,813,023, which is a division of application No. 08/497,534, Jun. 30, 1995, Pat. No. 5,655,105.

[51] Int. Cl.[7] ............................................... G11C 8/00
[52] U.S. Cl. ............................................ 365/233; 365/194
[58] Field of Search ........................... 365/194, 233, 365/195, 203, 189.05, 230.08; 711/105, 167

[56] References Cited

U.S. PATENT DOCUMENTS

| | | | |
|---|---|---|---|
| 5,325,502 | 6/1994 | McLaury | 395/496 |
| 5,386,385 | 1/1995 | Stephens, Jr. | 365/189.05 |
| 5,487,172 | 1/1996 | Park et al. | 395/800 |
| 5,502,835 | 3/1996 | Le et al. | 395/496 |
| 5,511,024 | 4/1996 | Atwood et al. | 365/189.04 |
| 5,526,506 | 6/1996 | Hyatt | 395/438 |
| 5,544,124 | 8/1996 | Zager et al. | 365/230.08 |
| 5,619,464 | 4/1997 | Tran | 365/203 |
| 5,655,105 | 8/1997 | McLaury | 365/194 X |
| 5,793,688 | 8/1998 | McLaury | 365/233 X |
| 5,813,023 | 9/1998 | McLaury | 365/233 X |

Primary Examiner—A. Zarabian
Attorney, Agent, or Firm—Dorsey & Whitney LLP

[57] ABSTRACT

A multiple latency synchronous dynamic random access memory includes separate two and three latency control circuits driven by an input latch circuit. Commands received at the multiple latency synchronous dynamic random access memory are converted to a separate set of command signals clocked through an input latch circuit by a feedback reset signal, such that commands are pipelined for three latency operation. In response to the command signals, the two latency control circuit produces a set of control signals according to a two latency algorithm. In response to the same command signals, the three latency control circuit independently produces a set of three latency control signals according to a three latency algorithm. In two latency operation, access time for signal development is externally controlled, while in three latency operation access time is internally controlled. In three latency operation, signal development time is determined separately for reads and writes. Also, in three latency operation, data is clocked along a data input path with a write latency. The multiple latency synchronous dynamic random access memory includes a pair of output data paths having different delays, where the data path is selected according to two or three latency operation.

20 Claims, 9 Drawing Sheets

METHOD AND APPARATUS FOR MULTIPLE LATENCY SYNCHRONOUS DYNAMIC RANDOM ACCESS MEMORY

CROSS-REFERENCE TO RELATED APPLICATIONS

This application is a continuation of U.S. patent application Ser. No. 08/783,922, filed on Jan. 17, 1997, now U.S. Pat. No. 5,813,023, which is a divisional of U.S. patent application Ser. No. 08/497,534, filed on Jun. 30, 1995, now U.S. Pat. No. 5,655,105.

TECHNICAL FIELD

The present invention relates to synchronously operated memories and, more particularly, to multiple latency synchronous operation of dynamic random access memories.

BACKGROUND OF THE INVENTION

Conventional non-pipelined dynamic random access memories (DRAMs) perform data transfers in sequence. That is, when a read or write command is received and an address is made available, the data transfer, either read or write, is performed in its entirety before another command is accepted. Consequently, subsequent commands are delayed by the entire duration of the original data transfer. Because data transfers typically involve several steps and each step takes time, the overall time to perform the original data transfer may be significant. For example, for a read, the control logic of the DRAM must decode the command and the address, provide signals, such as the row address select signal $\overline{RAS}$, and column address select signal, $\overline{CAS}$, perform precharge and equalization, address the memory array, allow time for sense amplifiers to develop signals, and transfer data from the sense amplifiers to output registers. Subsequent commands must wait until these operations are completed before they are accepted by the DRAM. Consequently, either the clock speed of the DRAM must be sufficiently slow to allow the original data transfer to be completed before a subsequent command is provided, or a dummy command, such as no-operation command NO-OP, must be provided at all clock edges until the data transfer is complete.

To reduce the amount of delay imposed in sequential data transfer operations, DRAMs can be "pipelined." In pipelining, each of the above-described steps is performed according to a specific timing sequence. For example, when the original data transfer progresses from a first step (e.g., command decode and address decode) to a second step (e.g., read data), a second data transfer progresses to the first step (command and address decode). Thus, the control logic can begin decoding the second command and an address decoder can begin decoding the second address while the data from the original data transfer is being read from or written to the memory array.

To control the flow of data through a pipelined DRAM, commands and data are transferred synchronously. In synchronous operation, the timing sequence is established relative to leading edges of a clock signal. At fixed times relative to the leading edges, commands are read by the control logic, addresses are provided at an address input, signals are developed on input and output lines of the memory array, and data is made available for reading or writing at a data bus.

In synchronous read operations, an output of data on the data bus results from a command and an address received at a preceding leading edge of the clock. The delay in number of clock cycles between the arrival of the read command at the input to the control logic and availability of data at the data bus is the "latency" of the pipelined DRAM. If the output data is available by the second leading edge of the clock following the arrival of the read command, the device is described as a two latency DRAM. If the data is available at the third leading edge of the clock following the arrival of the read command, the device is a three latency DRAM.

In conventional pipelined DRAMs, latency is only imposed for read operations. In write and block write operations, write and block write commands are supplied simultaneously with data at the data bus and transferred to the memory array as quickly as possible. Typical pipelined DRAMs may thus be described as having no write latency. Nevertheless, write and block write operations may take more than one clock period. In such cases, data from the write or block write may require the data bus for more than one leading edge of the clock. Consequently, a no operation command NO-OP may be required to prevent data collision after a write or block write commands.

Conventionally, control logic and data paths within two latency and three latency DRAMs are optimized for the particular latency of the device. By accurately controlling the timing of each step of the data transfer operation, decoded addresses, data and enabling signals arrive at the memory array substantially simultaneously. In response, signal development at the sense amplifiers begins at a prescribed time. Because the time at which data is to be output is determined by the latency (2 or 3 clock periods), the timing of signal development at the sense amplifiers can be optimized. Conversely, if the time necessary for signal development is known, the clock speed can be optimized for the amount of time necessary to perform all of the steps of the data transfer. In such pipelined DRAMs, the time period in which the data bus and address bus are occupied can be controlled accurately and the time at which the data bus and address bus are available for subsequent addresses and data is known. By tightly controlling the timing of signals on the address, command and data buses, the speed of data transfer through the DRAM can be optimized and data and command collisions can be minimized.

The timing requirements for two latency and three latency operation may differ. Therefore, devices are typically optimized for either two latency or three latency operation. Because three latency operation allows an additional clock cycle between the acceptance of a command and the actual transfer of data from the memory array, the clock speed of three latency devices is typically higher than for two latency devices.

SUMMARY OF THE INVENTION

An integrated multiple latency synchronous dynamic random access memory includes as its central element a memory array. The multiple latency synchronous dynamic random access memory receives externally produced command signals, data, and row and column addresses. In response, the multiple latency synchronous dynamic random access memory performs data transfer operations, including reading from the memory array and writing or block writing to the memory array.

The multiple latency synchronous dynamic random access memory receives the row and column addresses at an address register. Row addresses are transmitted to the memory array along a row address path. Column address follow a column address path to an IO interface coupled to the memory array. A logic controller receives and decodes the command signals to identify commands. The logic controller also receives data indicating whether two latency or three latency operation is selected. Based upon the decoded commands and the selected two or three latency operation, the logic controller controls the timing of the operations in the multiple latency synchronous dynamic random access memory by controlling the IO interface. Through its control of the IO interface, the logic controller also controls the transfer of addresses and data to and from the memory array.

The selection between two and three latency operation is made by a user. To select two latency mode, the user provides a "010" sequence of address bits and a defined set of command signals. To select three latency mode, a user supplies a "110" sequence of address bits and the defined set of command signals. In response to the defined set of command signals and the sequence address bits, a latency select circuit selects either two or three latency operation and produces a two latency signal or a three latency signal in response.

Control of the timing for two and three latency operation in the multiple latency synchronous dynamic random access memory is established within a latency control circuit in the logic controller. The latency control circuit includes an input latch section, a two latency control section and a three latency control section. The input latch section receives the command signals and produces a read signal, write signal and block write signal for input to the two and three latency control sections.

The two latency control section receives the read, write and block write signals from the input latch section. The two latency control section also receives the clock signal and the two latency signal produced by the latency select circuit. In response to these signals, the two latency control section produces several control signals, including a precharge signal, a decode enable signal and enable write signal, and a master-slave write pass signal. Each of the control signals is produced according to a two latency timing algorithm in the two latency control section.

The three latency control section also receives the read, write and block write signals, the clock signal, and the three latency signal produced by the latency select circuit. The three latency control section produces the same control signals as the two latency control section and also produces a master-slave write pass signal. However, the timing algorithm according to which the three latency control section produces the control signals is different from the timing algorithm of the two latency control section. Consequently, separate and independent circuits control the timing of control signals for two or three latency operation.

A reset signal within the three latency control section is fed back to the input latch section to control the timing of the read, write and block write signals from the input latch section. In two latency operation, the read, write and block write signals are produced quickly by the input latch section. In three latency operation, the read, write and block write signals are delayed until the reset signal arrives. Consequently, in three latency operation, the read, write and block write signals are pipelined.

For writing to the memory array, data arrives at a data bus and follows a data path from the data bus to the IO controller. Within the data path, data is clocked into a master input register under control of the logic controller. Data from the master input register is then clocked from the master input register into a pair of slave registers and a color register. In two latency operation, the data is clocked immediately from the master input register to the slave registers and color register. In three latency operation, clocking of data is delayed by approximately one clock period.

For read operations, data follows one of two output data paths. In three latency operation, the data is clocked into a master output register. Subsequently, data is clocked from the master output register to an output section by a gate controlled by the logic controller. Because the logic controller imposes a delay of approximately 1 clock cycle on the gating of data from the master output register to the data bus, the multiple latency synchronous dynamic random access memory can be said to have a write latency in three latency operation.

In two latency operation, data from the IO interface bypasses the master output register through a bypass path. The bypass path provides a direct path for data without the delay imposed by the master output register. Consequently, in two latency operation, data passes quickly form the IO interface to the data bus.

DETAILED DESCRIPTION OF THE DRAWINGS

Figure 1:
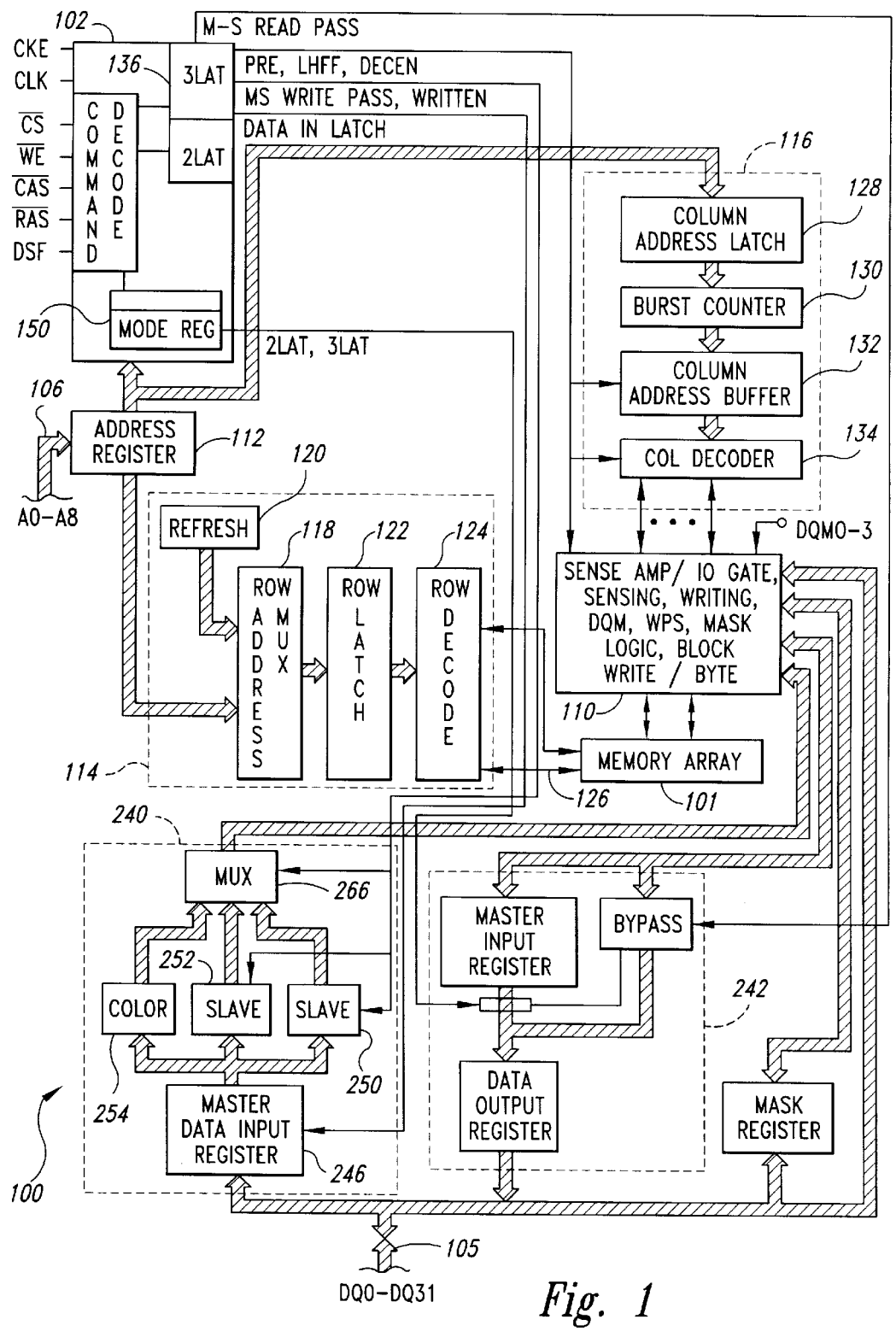
FIG. 1 is a block diagram of a multiple latency synchronous dynamic random access memory according to the invention.

As shown in FIG. 1, a multiple latency synchronous dynamic random access memory 100 having as its central memory element a memory array 101 operates under control of a logic controller 102. The logic controller 102 receives a system clock signal CLK, a clock enable signal CKE and several command signals that control reading from and writing to the multiple latency synchronous dynamic random access memory 100. Among the command signals are a chip select signal $\overline{CS}$, a write enable signal $\overline{WE}$, a column address select signal $\overline{CAS}$, a row address select signal $\overline{RAS}$ and a block write select signal DSF.

Figure 2:
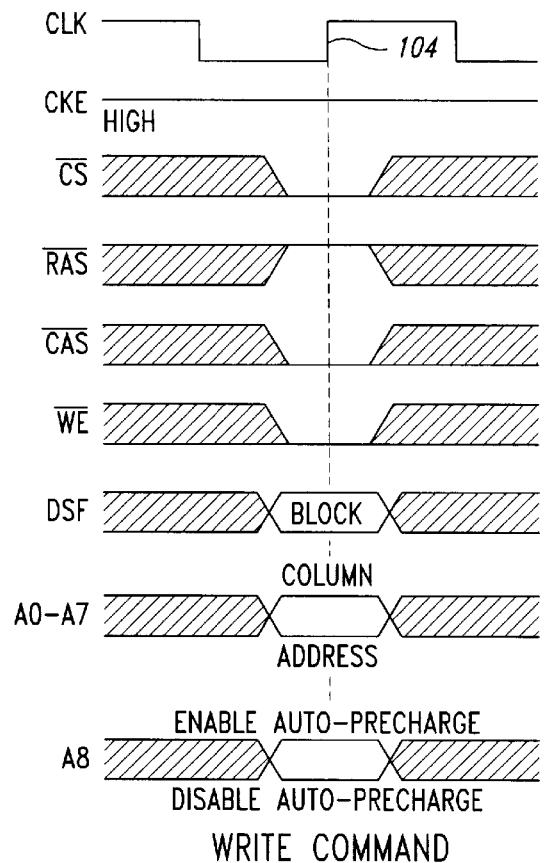
FIG. 2 is a signal timing diagram showing states of various command signals for a write command for input to the multiple latency synchronous dynamic random access memory of FIG. 1.
Figure 3:
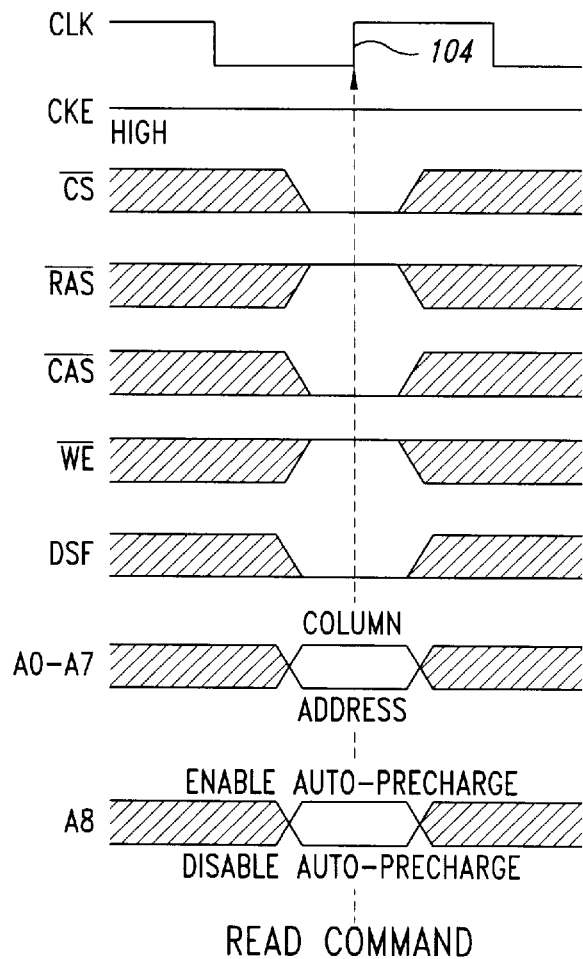
FIG. 3 is a signal timing diagram showing states of various command signals for a read command for input to the multiple latency synchronous dynamic random access memory of FIG. 1.

The logic controller 102 decodes the command signals according to a predetermined protocol to identify read, write and block write commands for execution by the multiple latency synchronous dynamic random access memory 100. FIGS. 2 and 3 show the clock and command signals and their states for write commands and read commands, respectively. The read and write commands differ only in the state of the write enable signal $\overline{WE}$. Except for the write enable signal $\overline{WE}$, the following discussion applies equally to FIGS. 2 and 3.

As indicated by the arrow 104, the leading edge of each pulse of the clock signal CLK establishes the time at which the states of the signals are determined. The clocking of the logic controller 102 by the clock signal CLK is enable by the clock enable signal CKE, which must be high for reading and writing. Also, reading and writing from the multiple latency synchronous dynamic random access memory 100 is only enabled when the multiple latency synchronous dynamic random access memory 100 is selected, as indicated by the chip select signal $\overline{CS}$. As indicated by the overbars in FIGS. 2 and 3, the chip select signal $\overline{CS}$ is a low-true signal. That is, when the multiple latency synchronous dynamic random access memory 100 is selected, the chip select signal $\overline{CS}$ is low.

The next two signals are the row and column address select signals $\overline{RAS}$ and $\overline{CAS}$. The row and column address select signals $\overline{RAS}$ and $\overline{CAS}$, like the chip select signal, $\overline{CS}$, are low-true signals. When true (low), the row address select signal $\overline{RAS}$ indicates that addresses on the address bus 106 are address rows in the memory array 101. A true column address select signal $\overline{CAS}$ indicates that addresses on the address bus 106 are addresses of columns in the memory array 101. During reading or writing, the column address select signal $\overline{CAS}$ is low (true) indicating that the address bits from the address bus 106 (FIG. 1) represent the column address, as shown for the address signals A0–A7. The row address select signal $\overline{RAS}$ is high (not true) indicating that the row address was determined at a different leading clock edge. As is conventional to DRAM operation, the row address is received and stored and selected row is activated prior to the column address select signal $\overline{CAS}$ going true (low). The following discussion assumes that the selected row has already been activated.

Immediately below the column address select signal $\overline{CAS}$ is the write enable signal $\overline{WE}$, which is also a row-true signal. If the write enable signal $\overline{WE}$ is true (low), the data transfer operation will be a write, as shown in FIG. 2. If the write enable signal $\overline{WE}$ is high (not true) the data transfer operation will be a read, as shown in FIG. 3. The next signal is the block write select signal DSF that distinguishes between conventional write commands and block write commands. The block write select signal DSF is low (not true) indicating that the commands are not block write commands. One skilled in the art will recognize that, in various embodiments, additional commands may be provided to and accepted by the logic controller 102. For example, a bank select signal BA would be supplied for a device having two memory banks.

The logic controller 102 decodes the above-described command signals, to determine whether a read, write, or block write command has been received. As will be discussed below, in response to the determined command the logic controller 102 controls reading from or writing to the memory array 101 by controlling an IO interface 110 and input and output data paths 240, 242. The IO interface 110 is any conventional IO interface known in the art and includes typical IO interface elements, such as sense amplifiers, DRAM compatible mask logic, precharge and equalization circuitry and input and output gating. Because the IO interface 110 is a known structure, it will not be described in detail herein. Operation of the IO interface 110 under control of the logic controller 102 is best explained after providing a description of the generation of control signals, and will be described below with respect to FIG. 9.

In addition to the command signals, the multiple latency synchronous dynamic random access memory 100 also receives addresses from an address bus 106 and receives or outputs data on a data bus 105. The received addresses may be row or column addresses. In either case, addresses from the address bus 106 are clocked into the multiple latency synchronous dynamic random access memory 100 through an address register 112. If an address is a row address, it is transmitted to the memory array 101 through a row address path 114. The row address path 114 includes a row address multiplexer 118 that receives row addresses from the address register 112 and receives a refresh signal from a refresh circuit 120. The row address multiplexer 118 provides the row addresses to a row latch 122 that latches the row addresses and provides the row addresses to a row decoder 124. The row decoder 124 takes the 8-bit address from the row latch and activates a selected one of 256 row address lines 126. The row address lines 126 are conventional lines for selecting the row addresses of locations in the memory array 101. As noted above, the following discussion assumes that the row address has been selected and the selected row is activated. The refresh signal from the refresh circuit 120 helps to maintain the activation of the row.

If the address received at the address register 112 is a column address, it is transmitted to the IO interface 110 and the memory array 101 through a column address path 116. The column address path 116 includes as its input element a column address latch 128 that receives and holds column addresses from the address register 112. The column address latch 128 then provides the column addresses to a burst counter 130. When the multiple latency synchronous dynamic random access memory 100 is not in block write mode, the burst counter 130 passes addresses unchanged. As discussed below, in a two latency operation, the burst counter 130 passes addresses immediately and in three latency operation the burst counter 130 passes addresses with a delay. The burst counter 130 is typically activated for graphics or video applications to more quickly step through sequential memory addresses. Addresses from the burst counter 130 drive a column address buffer 132 that stores the addresses and makes them available to a column decoder 134. The column decoder 134 decodes the 8-bit column address from the column buffer 132 and activates one of 256 columns of the memory array 101 in response. When the multiple latency synchronous dynamic random access memory 100 is in block write mode, the column decoder 134 is made to activate 8 columns simultaneously by ignoring the three least significant address bits.

A data input path 240 transmits data from the data bus 105 to the IO interface 110. An output data path 242 transmits data from the IO interface 110 to the data bus 105. Because an understanding of the generation and timing of control signals is beneficial in understanding the operation of the data paths 240, 242, the structure and operation of the input and output data paths 240, 242 will be discussed below with respect to FIG. 8, after a discussion of the generation and timing of the control signals.

As noted above, reading data from and writing data to the memory array 101 is performed according to a controlled timing sequence, such that the IO interface 110 is activated simultaneously with the decoded column address arriving at the IO interface from the column decoder 134. Because the row address is held by the row decoder 124 throughout the reading or writing operation, the timing of the row address path simply requires that the row addresses arrive before activation of the IO interface 110 and remain constant. The logic controller 102 thus controls timing of reading or writing by controlling the timing of the column address path 116, the data input and output paths 240, 242 and the IO interface 110.

In operation, the user provides a column address to the address bus 106, a command to the logic controller 102, and, for writes, data at the data bus at the same leading edge of the clock signal CLK. The column address should arrive at the output of the column decoder 134 at approximately the same time that the IO interface 110 is activated. Therefore, the time for transfer of the address through the address register 112 and the address path 116 is preferably approximately equal to the time for the logic controller 102 to decode the command and initiate setup steps, such as precharging.

An understanding of the timing of individual commands and their resultant signals in two and three latency operation is helpful in understanding the logic controller's control of data transfer operations in the IO interface 110, the row and column address paths 114, 116 and the input and output data paths 240, 242. Therefore, examples of simple two and three latency read timing will be described first. Thereafter, the circuitry for implementing the complete timing will be described with respect to FIGS. 6, 7, and 8.

Figure 4:
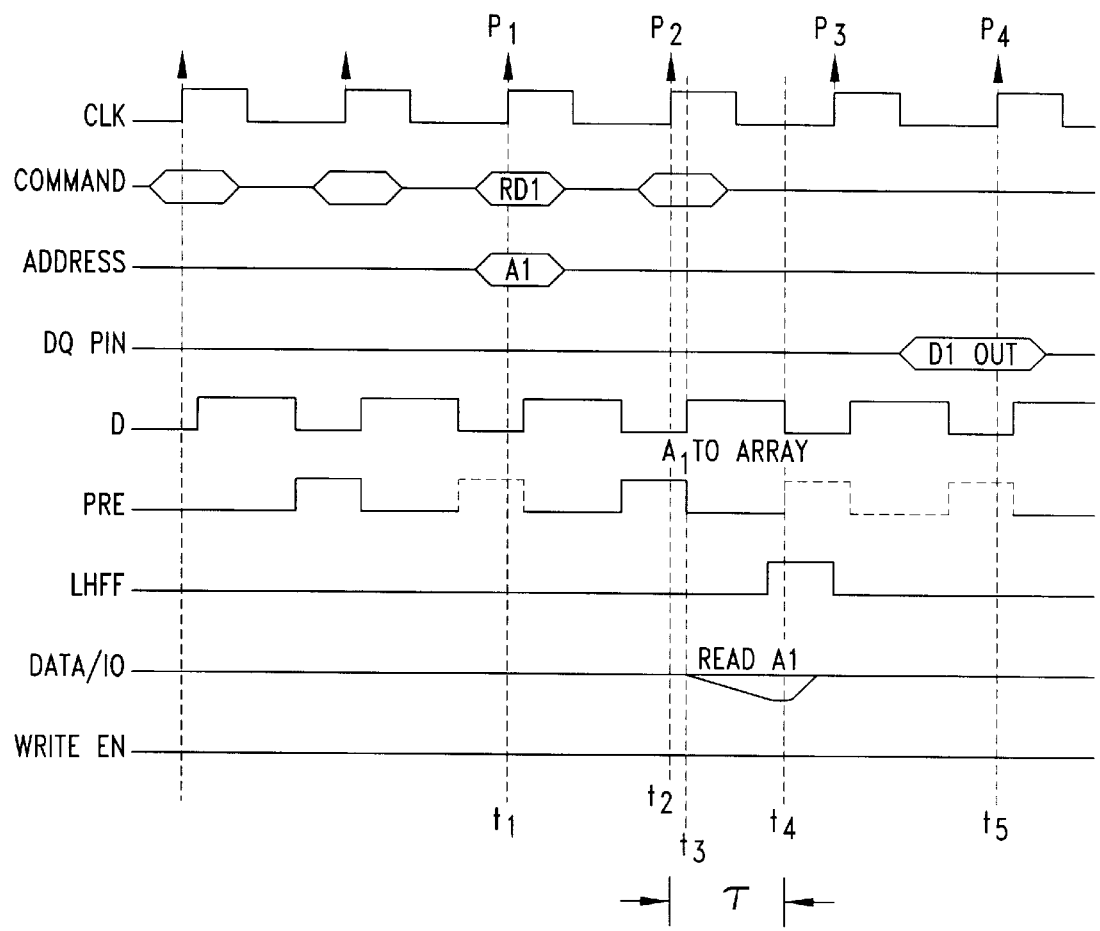
FIG. 4 is a signal timing diagram showing signals within the multiple latency synchronous dynamic random access memory of FIG. 1 in response to a read command for three latency operation.

FIG. 4 shows timing of selected signals for a three latency read operation. At a leading edge $P_1$ of the clock signal CLK at a time $t_1$ an external source (e.g., a microprocessor) supplies a read command RD1 and a column address A1 to the multiple latency synchronous dynamic random access memory 100. At the next leading edge $P_2$ at a time $t_2$ the precharge signal PRE is high and the enable write signal WRITEEN is low. The precharge signal PRE initiates precharging and equalization of signals in IO lines in the memory array 101. Because the enable write signal WRITEEN is low (not true), writing is not enabled, and the operation is a read. At a time $t_3$ shortly after the leading edge $P_2$, precharging ends and the column address A1 arrives at the IO interface 110. The IO interface 110 activates the column identified by the address to initiate "reading from" the memory array 101. Signals then develop in the memory array 101 indicating whether the data at the address A1 is a "1" or a "0," as represented in FIG. 4 by the diverging lines in the Data/IO signal. After a period of time sufficient to develop signals, a latch helper flip flop signal LHFF is generated. The latch helper flip flop signal LHFF initiates sampling of data in the IO interface 110 and causes the sampled data to be latched near a time $t_4$. The data latched in response to the latch helper flip flop signal LHFF is then output after a leading edge $P_3$ of the second clock pulse after the read command RD1, such that the data is available by the leading edge $P_4$ of the third clock pulse following the read command RD1. Because the data is made available at the leading edge $P_4$ of the third clock pulse after the read command RD1, the read operation is a three latency read.

Figure 5:
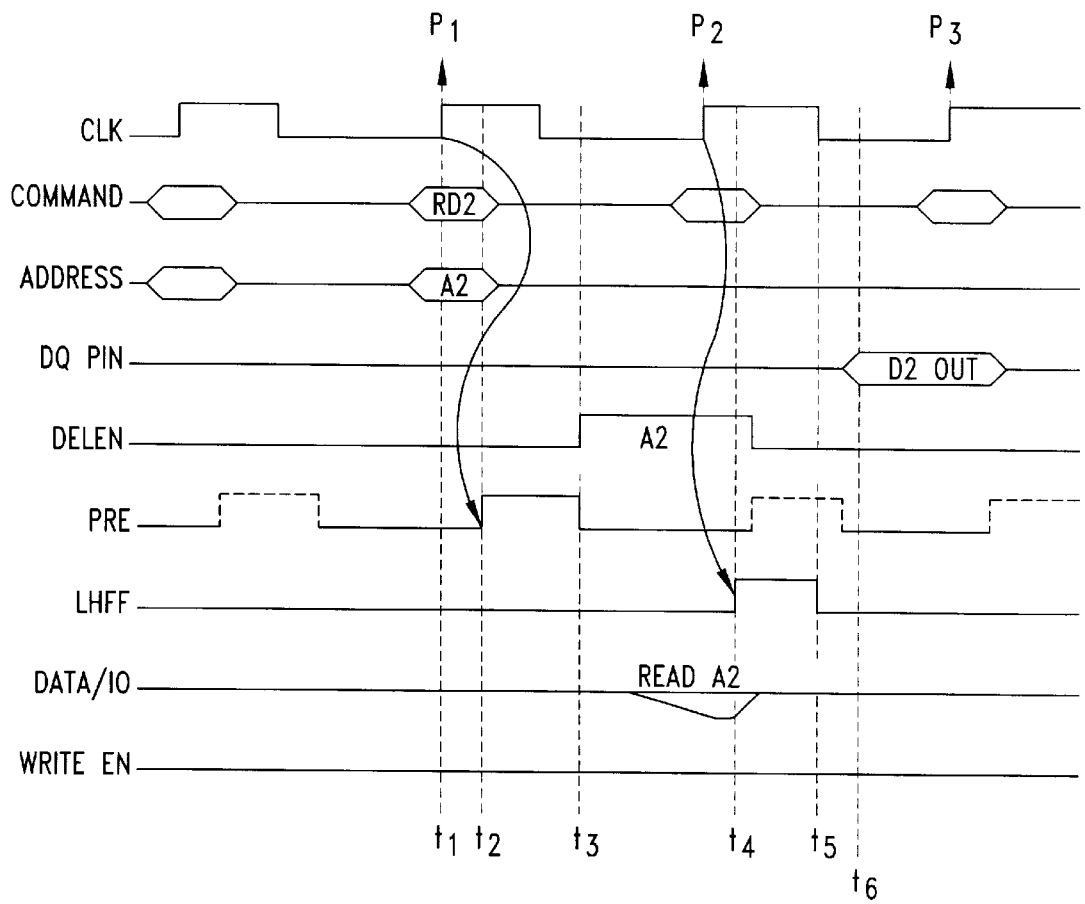
FIG. 5 is a signal timing diagram showing signals within the multiple latency synchronous dynamic random access memory of FIG. 1 in response to a read command for two latency operation.

A comparison to two latency read timing demonstrates how the signal timing differs between two and three latency reads. A two latency read timing diagram is shown in FIG. 5. At a first leading edge $P_1$ of the clock signal CLK at a time $t_1$, a read command RD2 and an address A2 arrive at the multiple latency synchronous dynamic random access memory 100. A short time thereafter, at a time $t_2$, the precharge signal PRE goes high and precharging and equalization begin. At the end of the precharge period at a time $t_3$, the address A2 is provided to the memory array 101 from the column decoder 134 and signal development begins.

At a time $t_4$, determined with respect to a second leading edge $P_2$ of the clock signal CLK, the latch helper flip flop signal LHFF initiates sampling of the developed signal to produce the sampled data. After a short period, sampling ends at a time $t_5$. At a time $t_6$, almost immediately after the data are sampled, the data are output at the data bus 105 so that the data are available at a leading edge $P_3$ of the second clock pulse following the read command RD2.

Several differences between two and three latency timing are apparent from the above discussion. First, in two latency operation, the developed signal is sampled almost immediately before data is output at the data bus 105, as contrasted with the delay between sampling and output of approximately 1 clock cycle for the three latency read of FIG. 4. Moreover, in two latency operation, the precharge period begins as quickly as possible after the read command RD2 and address A2 have been provided, while in three latency operation, the precharge period (for a previous operation) ends almost simultaneously with the arrival of the read command RD1 and address A1. Also, in two latency operation, the address A2 is decoded and provided to the memory array 101 before the second leading edge $P_2$.

Figure 6:
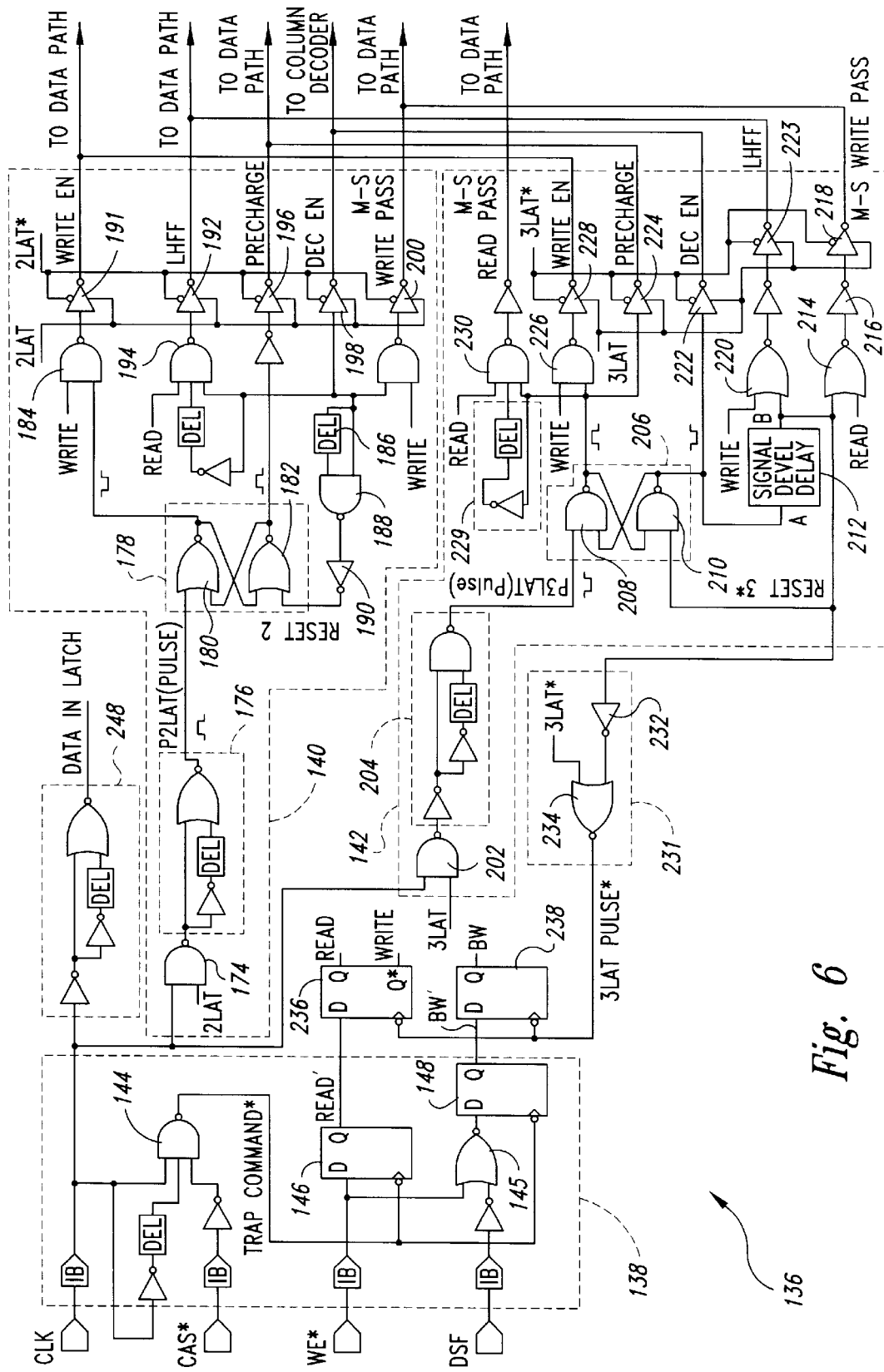
FIG. 6 is a schematic of a latency control circuit within the multiple latency synchronous dynamic random access memory of FIG. 1.

The signal timing for two latency and three latency operation is established principally by the latency control circuit 136 within the logic controller 102, as shown in greater detail in FIG. 6. The latency control circuit 136 includes three principal sections, an input latch section 138, a two latency control section 140, and a three latency control section 142.

The input latch section 138 receives the clock signal CLK, the column address select signal $\overline{CAS}$, the write enable signal $\overline{WE}$, and the block write select signal DSF. In response, the input latch section 138 provides to the two and three latency control sections 140,142 three command signals, including the read signal READ, the write signal WRITE and the block write signal BW. Within the input latch section 138, the clock signal CLK is input directly to a first input of a NAND gate 144. A delayed inverse of the clock signal is input to a second input of the NAND gate 144 such that the first and second inputs of the NAND gate 144 simultaneously receive "1's" only if a high clock signal immediately follows a low clock signal, i.e., a rising or "leading" edge is detected. The third and final input of the NAND gate 144 receives an inverse of the column address select signal $\overline{CAS}$, such that the third input is a "1" if the column address select signal $\overline{CAS}$ is low (true). The NAND gate conditions are satisfied and the NAND gate 144 temporarily outputs a "0" when columns are being addressed at the time a leading clock edge is detected. One skilled in the art will recognize that the second input of the NAND gate 144 will, after a delay, go low and the output of the NAND gate 144 will be forced to a "1."

The combination of a direct input of the clock signal CLK and a delayed inverse are used several times within the logic controller 102 to detect leading edges of the clock signal CLK. Such direct input/delayed inverse combinations will be referred to herein as leading edge detectors. Leading edge detectors are used to generate pulses (which can go high or low) for a sufficient amount of time to set a latch or load a register. In some configurations, the delay of such leading edge detectors can cause a delayed response to a leading edge, such that the output of the leading edge detector lags the leading edge.

The output of the NAND gate 144 is input to inverted clock inputs of a pair of latches 146, 148 to clock commands through the latches 146, 148. From the above discussion, it can be seen that the inverted clock inputs of the latches 146, 148 clock command signals from the data inputs D to the data outputs Q, $\overline{Q}$ at leading edges of the clock signal CLK if the column address select signal $\overline{CAS}$ is true (low).

The command signal input to the first latch 146 is the write enable signal $\overline{WE}$. The latch 146 therefore outputs a "1" if the write enable signal $\overline{WE}$ is high (not true) and the column address select signal $\overline{CAS}$ is true when the leading clock edge is received. In other words, the first latch 146 outputs a "1", if a read command is issued. Otherwise, a "0" is output, indicating that a write or block write command has been issued. The output Q of the latch 146 is used as an interim read signal READ', to indicate that a read command has been received.

The command input to the second latch 148 is a NOR combination of the write enable signal $\overline{WE}$ and an inverse of the block write select signal DSF. As dictated by a NOR gate 145, the output Q of the second latch 148 is a "1" only if the write enable signal $\overline{WE}$ is true and the block write select signal DSF indicates that the device is in block write mode. The output Q of the second latch 148 is thus an interim block write signal BW' indicating that a block write command has been received.

The interim read signal READ' and the interim block write signal BW' are output through a pair of latches 236, 238 to produce a read signal READ, a write signal WRITE and a block write signal BW. The timing of the read signal READ, write signal WRITE and block write signal BW relative to the interim read and block write signals READ', BW' is controlled by a three latency latch pulse 3LATPULSE produced within the three latency control section 142, as will be discussed below.

The two and three latency control section 140, 142 each receive the read signal READ, write signal WRITE and block write signal BW from the input latch section 138. The two latency control section 140 also receives the clock signal CLK and a pair of complementary two latency signal 2LAT and 2LAT*. The three latency control section 142 similarly receives the clock signal CLK, and complementary three latency signals 3LAT, 3LAT*. In response, each of the two latency and three latency control sections 140, 142, produces several control signals for controlling data flow and enabling decoding during two latency and three latency operation, respectively. The complimentary two and three latency signals 2LAT, 2LAT* and 3LAT, 3LAT* are produced in the logic controller 102 in a latency mode control circuit 150, shown in greater detail in FIG. 7.

Figure 7:
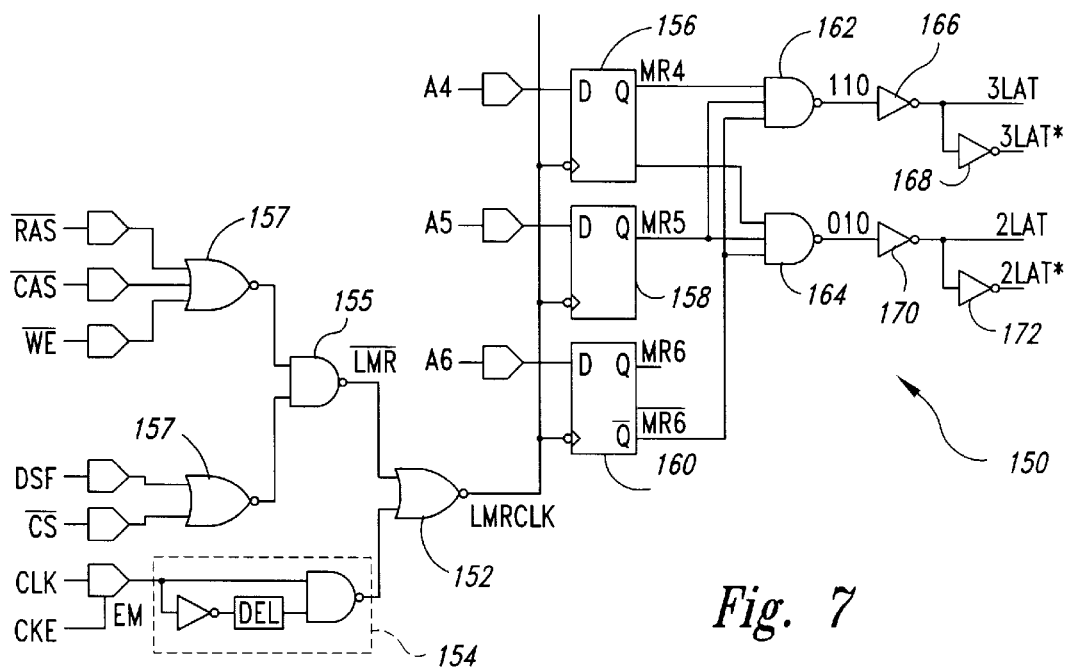
FIG. 7 is a schematic diagram of a mode select circuit for producing two and three latency control signals in response to input signals.

As shown in FIG. 7, the latency mode control circuit 150 includes as its central elements three registers 156, 158, 160 each driven by 3 bits A4, A5, A6 of the address and clocked by a load mode register clock signal LMRCLK. The address bits A4, A5, A6 are external inputs to allow the user to select the latency mode. The load mode register clock signal LMRCLK is generated at a NOR gate 152 in response to a leading edge-based input and a load mode register signal $\overline{LMR}$. The leading edge-based input to the NOR gate 152 comes from a leading edge detector 154 that provides a low-going pulse when the clock is enabled and a leading edge of the clock signal CLK is detected. The load mode register signal $\overline{LMR}$ is a low-true signal that is provided by a NAND gate 155 driven by a pair of NOR gates 157.

The NOR gates 157 and NAND gate 155 establish the conditions for the load mode register signal $\overline{LMR}$. The load mode register signal $\overline{LMR}$ is true (low) only when the row address select signal $\overline{RAS}$, the column address select signal $\overline{CAS}$, the write enable signal $\overline{WE}$, and the chip select signal $\overline{CS}$ are all true, and the block write select signal DSF is not true. This set of command signals is designated as an industry standard set of command signals which, together with a leading edge of the clock signal CLK correspond to a load mode register command.

The load mode register clock signal LMRCLK is thus a high-going pulse in response to a load mode register command. The load mode register clock signal LMRCLK clocks the three user-supplied address bits A4, A5, A6 through the three mode registers 156, 158, 160 to a pair of three input NAND gates 162, 164. The first NAND gate 162 receives the register outputs Q from the first and second registers 156, 158 and receives the inverted register output $\overline{Q}$ from the third mode register 160 such that the first NAND gate 162 outputs a "0", only when the address bits A4, A5, A6 are "1,", "1", and "0", respectively. The output of the first NAND gate 162 is inverted at an inverter 166 to produce the three latency signal 3LAT. The three latency signal 3LAT is re-inverted at another inverter 168 to produce the inverse three latency signal 3LAT*. Thus, the three latency signal 3LAT is produced when the address bits A4, A5, A6 are "110," and the load mode register command has been issued (i.e., the row address select signal $\overline{RAS}$ is true, the column address select signal $\overline{CAS}$ is true, the write enable signal $\overline{WE}$ is true, chip select signal $\overline{CS}$ is true and the block write select signal DSF is not true).

The second NAND gate 164 receives the inverted register outputs $\overline{Q}$ from first and third mode registers 156, 160 and the register output Q from the second mode register 158 such that the second NAND gate 164 produces a "0" when the address bits A4, A5, A6 are "0", "1", and "0", respectively. The output of the second NAND gate 164 is inverted at an inverter 170 to produce the two latency signal 2LAT which is re-inverted at another inverter 172 to produce the inverse two latency signal 2LAT*. The two latency signal 2LAT is thus produced when the address bits A4, A5, A6 are "010" and a load mode register command has been issued.

As can be seen from the above description, the latency mode control circuit 150 produces the complementary latency signals 2LAT, 2LAT* or 3LAT, 3LAT* in response to the load mode register command, and the address bits A4, A5, A6. Because the address signals A4, A5, A6 are provided externally, the latency signals 2LAT, 2LAT* or 3LAT, 3LAT* are chosen externally by setting the address bits to 010 or 110, respectively.

Returning to FIG. 6, in the two latency control section 140, the two latency signal 2LAT and the clock signal CLK are combined at an input NAND gate 174. The output of the input NAND gate 174 is, in turn, coupled to a leading edge detector 176. The combination of the input NAND gate 174 and the leading edge 176 produces a high-going two latency pulse P2LAT when the two latency signal 2LAT is high and a leading edge of the clock signal CLK occurs. The two latency pulse P2LAT becomes the principal clocking signal for the two latency control section 140.

In the two latency control section 140, the two latency pulse P2LAT drives a latch circuit 178 formed from cross-coupled NOR gates 180, 182, causing the output of the upper NOR gate 180 to go low. The output of the upper NOR gate 180 forms one output of the latch 178 and is used to produce the enable write signal WRITEEN.

Prior to receiving the two latency pulse 2PLAT, the upper NOR gate 180 provides a "1" to a write enable NAND gate 184. The remaining input of the write enable NAND gate 184 receives the write signal WRITE. Thus, prior to the two latency pulse P2LAT, the write enable NAND gate 184 outputs a "0" if the write signal WRITE is high. The output of the write enable NAND gate 184 is then inverted at a tristate inverter 191 enabled by the two latency signals 2LAT, 2LAT* to produce the enable write signal WRITEEN.

When the two latency pulse P2LAT occurs, the output of the upper NOR gate 180 goes low and the write enable NAND gate 184 outputs a "1". The "1" from the write enable NAND gate 184 causes the enable write signal WRITEEN to go low. In two latency mode then, when the write signal WRITE is high, the enable write signal WRITEEN is set not true by the two latency pulse P2LAT.

Returning to the latch circuit 178, the output of the lower NOR gate 182 follows a reset loop including a delay block 186, a NAND gate 188, and an inverter 190 to produce a reset signal RESET2 at a second input of the lower NOR gate 182. The reset signal RESET2 resets the latch 178 such that the output of the upper NOR gate 180 returns to "1" after a delay τ. Thus, the output of the upper NOR gate 180, after being driven low by the two latency pulse P2LAT returns to a high state after the delay τ. In response, the enable write signal WRITEEN (assuming the write signal WRITE is still high and the two latency signals 2LAT, 2LAT* are still active) will return to the high state after the delay τ. In summary, the two latency pulse 2PLAT causes the enable write signal WRITEEN to go low for the selected period of the delay τ. After the delay τ, the latch 178 resets and the enable write signal WRITEEN returns high. As will be discussed hereinafter with respect to FIG. 8, the enable write signal WRITEEN, by temporarily going low, blocks development of signals during write operations to allow prewriting operations, such as precharging, to occur prior to the actual writing of data to the memory array 101.

Returning once again to the latch 178, the output of the lower NOR gate 182 also forms an input to four logic lines, producing the latch helper flip-flop signal LHFF, the precharge signal PRE, the decode enable signal DECEN, and the master-slave write pass signal M-S WRITEPASS. The latch helper flip-flop signal LHFF is produced by a tristate inverter 192 driven by a leading edge detector 194 enabled by the read signal READ. The leading edge detector 194 produces a low-going pulse when the read signal READ is high and the output of the lower NOR gate 182 goes high in response to the two latency pulse P2LAT. The latch helper flip-flop signal LHFF from the tristate inverter 192 is thus a high-going pulse slightly delayed with respect to the two latency pulse P2LAT, such that the latch helper flip flop signal LHFF is delayed slightly with respect to the clock signal CLK. As will be described hereinafter, the latch helper flip-flop signal LHFF helps latch data from the memory array 101 during read operations.

The second signal developed in response to the output of the lower NOR gate 182 in the latch 178 is the precharge signal PRE. The precharge signal PRE is equal to the output of the lower NOR gate 182 inverted by a tristate inverter 196. The leading edge of the precharge signal PRE is delayed only by the delay of the leading edge detector 176 and gate delays of the NAND gate 174 and the upper NOR gate 180. Thus, the precharge signal PRE is substantially undelayed with respect to leading edges of the clock signal CLK. Unlike the latch helper flip flop signal LHFF, the precharge signal PRE is driven low by the output of the lower NOR gate 182, rather than by the leading edge detector 194. Consequently, the length of time that the precharge signal PRE is high is controlled by the timing of the reset loop, not by a delay from a leading edge detector. As will be described hereinafter, the precharge signal PRE initiates precharging and equalization in the memory array 101.

The third signal produced in response to the output of the lower NOR gate 182 is the decode enable signal DECEN. The decode enable signal DECEN is simply the output of the lower NOR gate 182 as inverted and amplified by a tristate inverter 198. The decode enable signal DECEN is thus substantially undelayed with respect to leading edges of the clock signal CLK. The decode enable signal DECEN enables the column decoder 134 (FIG. 1) to provide addresses to the memory array 101.

The final signal produced in response to the output of the second NOR gate 182 is the master-slave write pass signal M-S WRITEPASS. The master-slave write pass signal M-S WRITEPASS is the logical AND of the output from the second NOR gate 182 with the write signal WRITE as driven by a tristate inverter 200. As will be described hereinafter with respect to FIG. 8 the master-slave write pass signal M-S WRITEPASS is used to control data flow along the input data path 240 to the memory array 101.

The three latency control section 142, like the two latency control section 140 described above, produces the enable write signal WRITEEN, the precharge signal PRE, the decode enable signal DECEN, the latch helper flip-flop signal LHFF, and the master-slave write pass signal M-S WRITEPASS. However, the timing of control signals from the three latency control section 142 differs from that of the two latency control section 140. Also, the three latency control section 140 produces an additional control signal, the master-slave read pass signal M-S READPASS, not found in the two latency control section 140.

The three latency control section 142 receives the clock signal CLK and the three latency signal 3LAT at a NAND gate 202 and processes the output of the NAND gate 202 with a pulse circuit 204 to produce a low-going three latency pulse P3LAT. The three latency pulse P3LAT forms the principal clocking signal for the three latency control section 142.

The three latency pulse P3LAT drives a latch 206 formed from cross-coupled NAND gates 208, 210. In response to the three latency pulse P3LAT, the output of the upper NAND 208 gate goes high. As with the latch 178 of the two latency control section 140, the latch 206 is reset by an internally generated reset signal $\overline{RESET3}$. The reset signal $\overline{RESET3}$ is produced by delaying an output of the lower NAND gate 210 at a signal delay block 212. The reset signal $\overline{RESET3}$ is then applied to a remaining input of the lower NAND gate 210 to reset the latch 206 after a delay τ causing the output of the upper NAND gate 208 to return low. The output of the upper NAND gate 208 thus goes high for a selected period of time in response to the three latency pulse P3LAT and then returns low.

Figure 11:
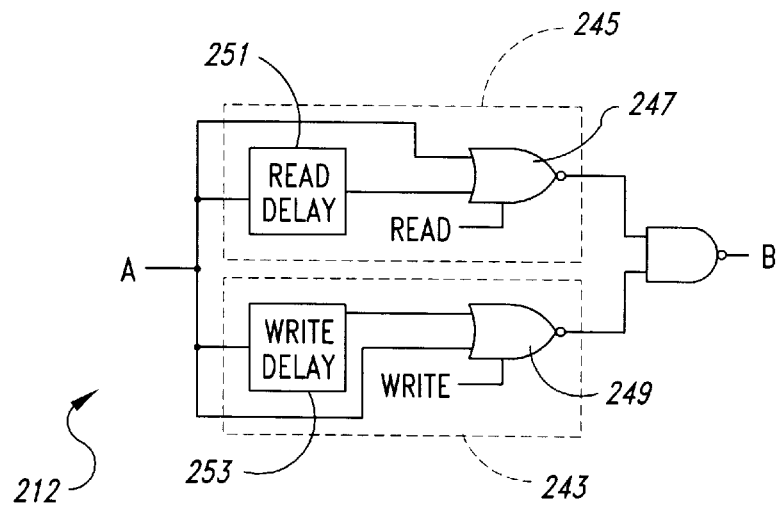
FIG. 11 is a detailed view of a signal delay block within the three latency control section of FIG. 6.

The delay τ of the latch 206 in the three latency control section 142 differs from the delay τ of the latch 178 in the two latency control section 140. Also, to allow the timing of the three latency control section 142 to be optimized for read and write operations, the signal delay block 212 includes two parallel paths 243, 245, each having a different delay, as shown in FIG. 11. Each of the paths 243, 245 receives the output of the lower NAND gate 210 at a respective edge detector including a respective NOR gate 247, 249. The NOR gates 247, 249 are enabled by the read signal READ and the write signal WRITE, respectively, such that only one of the paths 243, 245 is active at any time. Within the edge detectors, respective delay blocks 251, 253 establish respective delays for the paths 243, 245. Because the delays of the paths 243, 245 are independent, the delays for read and write operations may be established independently to separately optimize timing for reading and writing.

The output of the upper NAND gate 208 drives a tristate inverter 224 to produce the precharge signal PRE. The precharge signal PRE is driven low by the three latency pulse P3LAT until the reset signal $\overline{RESET3}$ resets the latch 208. The precharge signal PRE is thus inhibited for a selected period of time by the three latency pulse P3LAT. Inhibiting precharging after a leading edge allows time for signal development in the memory array for a previous read or write operation. Because the precharge signal PRE has no other conditions, the precharge signal PRE is produced in response to each three latency pulse P3LAT after the delay of the signal delay block 212.

The output of the upper NAND gate 226 is also used to produce the enable write signal WRITEEN. First, the output of the upper NAND gate 208 and the write signal WRITE are input to a NAND gate 226. The NAND gate 226 produces a high-going pulse in response to the three latency pulse P3LAT if the write signal WRITE is high. The output of the NAND gate 226 then drives a tristate inverter 228 to produce the enable write signal WRITEEN.

As will be discussed below, in three latency operation, the read signal READ and write signal WRITE are delayed by one clock cycle. Consequently, the enable write signal WRITEEN will be delayed by one clock period due to its independence upon the write signal WRITE.

In addition to driving the delay block 212 to produce the reset signal $\overline{RESET3}$, the output of the lower NAND gate 210 drives a tristate inverter 222 to produce the decode enable signal DECEN. The decode enable signal DECEN is thus a high going pulse, staying high for approximately the delay $\tau$ of the signal delay block 212. The decode enable signal DECEN is delayed with respect to the clock signal CLK only the response time of the NAND gate 202, the pulse generator 204, the upper NAND gate 208 and the tristate inverter 222, and thus closely follows the leading edge of the clock signal CLK.

In addition to resetting the latch 206, the reset signal $\overline{RESET3}$ from the delay block 212 is also used to produce the master-slave write pass signal M-S WRITEPASS. The reset signal $\overline{RESET3}$ is combined with the read signal READ at a NOR gate 214 to drive an inverter 216 and a tristate inverter 218 to produce the master-slave write pass signal M-S WRITEPASS when the read signal READ is not true. The master-slave write pass signal M-S WRITEPASS signal is thus a delayed version of the reset signal $\overline{RESET3}$, but, is enabled only when the read signal READ is low (i.e., write operation has been selected). Like the enable write signal WRITEEN the master-slave write pass signal M-S WRITEPASS signal is delayed by an extra clock cycle due to its dependence on the read signal READ.

The reset signal $\overline{RESET3}$ is also combined with the write signal WRITE at a NOR gate 220 and output through a tristate inverter 223 to produce the latch helper flip-flop signal LHFF when the write signal WRITE is low. The latch helper flip flop signal LHFF is thus produced only when the write signal WRITE is not true (i.e., read operation is selected). Because the latch helper flip flop signal LHFF is produced from the reset signal $\overline{RESET3}$, it is delayed relative to leading edges of the clock signal CLK by the delay $\tau$ of the signal delay block 212. As with the enable write signal WRITEEN, the latch helper flip flop signal LHFF is further delayed by one clock cycle due to its dependence upon the delayed write signal WRITE. Consequently, the latch helper flip flop signal LHFF is produced approximately one delay $\tau$ plus one clock cycle after their corresponding read or write commands. This timing is visible for the latch helper flip flop signal LHFF for the read command RD1 in FIG. 4.

In addition to producing the same control signals as the two latency control section 140, the three latency control section 142 also produces a master-slave read pass signal M-S READPASS for use by the output data path 242, described below with respect to FIG. 8. The master-slave read pass signal M-S READPASS is produced by inverting the output of a NAND gate 230 driven by a leading edge detector 229 connected to the output of the upper NAND gate 208 and enabled by the read signal READ. The master-slave read pass signal M-S READPASS is therefore a high-going pulse in response to the three latency pulse P3LAT and the read signal READ. Because the master-slave read pass signal M-S READPASS is dependent upon the read signal READ it will be delayed by one clock period from its corresponding read command. Note that the duration of the pulse from the NAND gate 230 is dictated by the duration of the delay from the leading edge detector 229 and is not necessarily equal to the duration of the three latency pulse P3LAT and is shorter than the delay of the signal delay block 212.

Each of the control signals (except the master-slave read pass signal M-S READPASS) from the three latency control section 142 is supplied to the same line as the corresponding signal from the two latency control section 140. However, in each of the two and three latency control sections 140, 142 signals are produced by tristate inverters driven by either the two latency or three latency signal 2LAT, 2LAT* or 3LAT, 3LAT*. Because the two latency signals 2LAT, 2LAT* and three latency signals 3LAT, 3LAT* are mutually exclusive, the tristate inverters of only one of the control sections 140, 142 will be enabled. During two latency operations, the two latency signals 2LAT, 2LAT* enable the tristate inverters 191, 192, 196, 198, 200 in the two latency control section 140 while the tristate inverters 218, 222, 223, 224, 228 in the three latency control section 142 are disabled and present high impedances. During three latency operation, the tristate inverters 218, 222, 223, 224, 228 in the three latency control section 142 are enabled by the three latency signals 3LAT, 3LAT*, while the tristate inverters 191, 192, 196, 198, 200 in the two latency control section 140 are disabled. Consequently, only one of the latency sections 140, 142 will provide the control signals at any time.

As previously noted, in three latency operation the read signal READ and the write signal WRITE are delayed relative to their corresponding read and write commands. This delay is realized by feeding back the reset signal $\overline{RESET3}$ from the latch 206 through a signal feedback section 231. In the signal feedback section 231, the reset signal $\overline{RESET3}$ is inverted at an inverter 232 and combined at a NOR gate 234 with the inverted three latency signal 3LAT*. If three latency operation is chosen, the inverse three latency signal 3LAT* will be "0". Thus, in three latency operation, when the reset signal $\overline{\text{RESET3}}$ goes low, the inverter 232 provides a "1" to the NOR gate 234 and produces a "0" at the output of the NOR gate 234. The output of the NOR gate 234 will remain low only as long as the reset signal $\overline{\text{RESET3}}$ remains low. Therefore, in three latency operation, the NOR gate 234 outputs a low-going three latency latch pulse $\overline{\text{3LATPULSE}}$.

The three latency latch pulse $\overline{\text{3LATPULSE}}$ drives clock inputs of the registers 236, 238 to clock the interim read signal READ' through the register 236 to produce the read signal READ and to clock the interim block write signal BW' through the register 238 to produce the block write signal BW. The write signal WRITE is derived as the inverse of the read signal READ by using the $\overline{\text{Q}}$ output of the register 236. Because the interim signals READ' and BW' are clocked through the registers 236, 238 by the delayed reset signal $\overline{\text{RESET3}}$ from the signal delay block 212, the signals READ, WRITE, and BW will be delayed by approximately the delay τ of the signal delay block 212. The latch 206 is reset by the reset signal $\overline{\text{RESET3}}$ before the three latency latch pulse $\overline{\text{3LATPULSE}}$ can clock the interim signals READ' and BW' through the registers 236, 238. Therefore, for a first leading edge, the read signal READ and write signal WRITE will not reach the NAND gates 230, 226 or the NOR gates 220, 214 before the latch 206 is reset. Instead, the read signal READ and write signal WRITE will be available when a subsequent three latency pulse 3PLAT arrives.

Note that in two latency operation, the inverted three latency signal 3LAT* will always be high. Thus, the output of the NOR gate 234 will always be low and the feedback section 231 will always feed back a "0." Consequently, the interim signals READ' and WRITE' will pass through the registers 236, 238 subsequently undelayed in two latency operation.

For completeness of description, it is noted that the latency control circuit 136 also produces a data-in latch signal DINL. The data-in latch signal DINL is derived from the clock signal CLK by a leading edge detector 248. The data-in latch signal DINL is thus a pulse following shortly after every leading edge of the clock signal CLK. As its name indicates, the data in latch signal DINL is used to latch data from the data bus 105.

Data transfer along the data paths 240, 242 will now be described. As noted above, the enable write signal WRITEEN, latch helper flip-flop signal LHFF, precharge signal PRE, decode enable signal DECEN, master-slave write pass M-S WRITEPASS, and master-slave read pass signal M-S READPASS are supplied by the two to three latency control section 140, 142 to the input data path 240 and/or the output data path 242. The input data path 240 transfers data from the data bus 244 to the IO interface 110. The output data path 242 transfers data from the IO interface 110 to the data bus 244.

Figure 8:
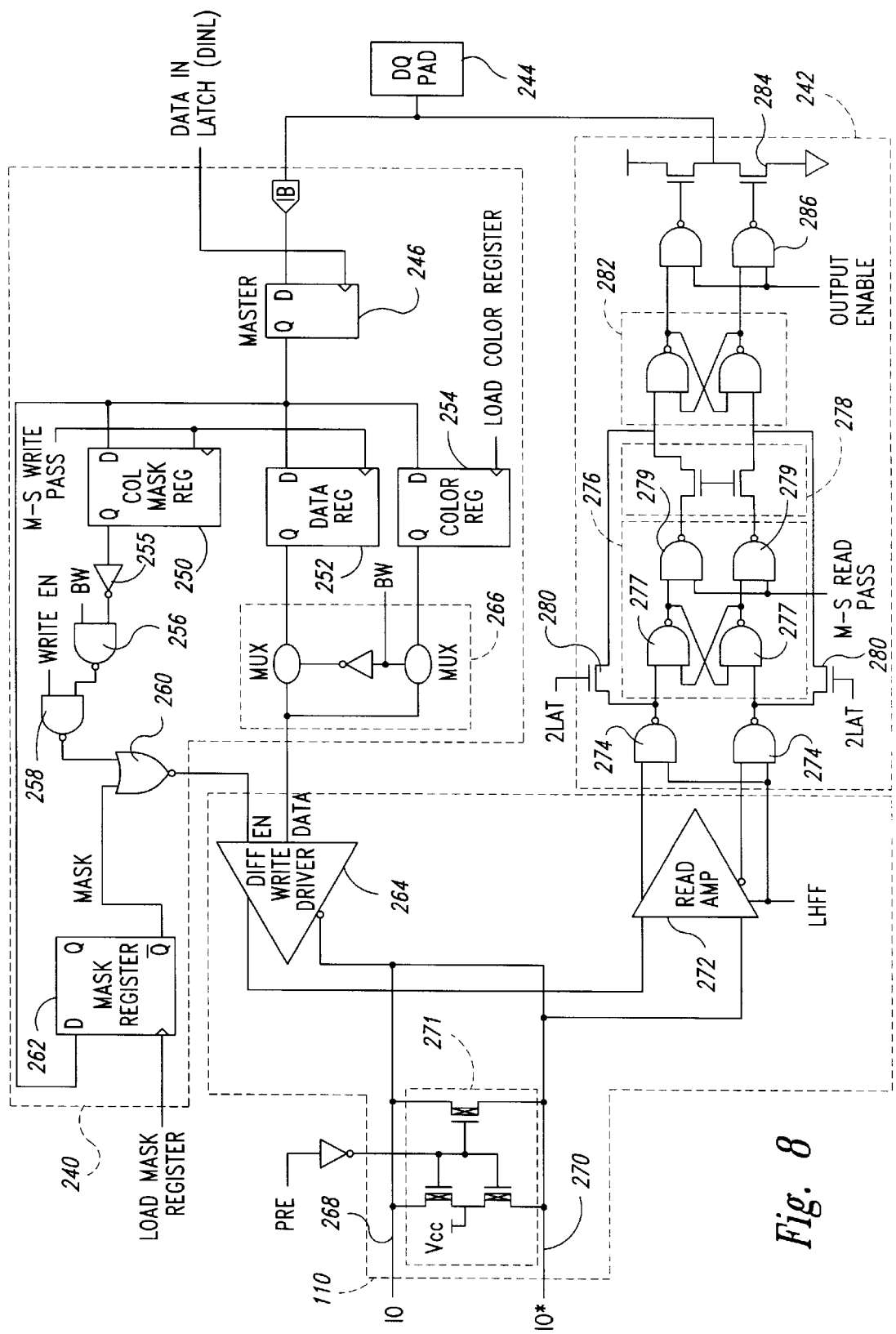
FIG. 8 is a circuit schematic showing in greater detail input and output data paths of the multiple latency synchronous dynamic random access memory of FIG. 1.

The input and output data paths 240, 242 are shown in greater detail in FIG. 8, along with a portion of the IO interface 110. The input data path 240 will be described first. Data from the data bus 105 arrives at the master input register 246 and is clocked almost immediately through the master input register 246 by the data-in latch command DINL. Data clocked through the master input register 246 is provided to data inputs D of two slave registers 250, 252 and the data input D of a color register 254. Data is clocked through each of the slave registers 250, 252 by the master-slave write pass signal M-S WRITEPASS from the latency control circuit 136 of FIG. 6.

The output of the first slave register 250 is used to enable signal development at a differential write driver 264 in block write mode. First, the output of the first slave register 250 is inverted at an inverter 255. The inverter output combined at a NAND gate 256 with the block write signal BW to produce an input for a NAND gate 258. The remaining input of the NAND gate 258 receives the enable write signal WRITEEN. The output of the NAND gate 258 is therefore a "0" only when data from the slave register is a "1", block write operation is selected, and the enable write command WRITEEN is high. These conditions correspond to a block write operation. In standard write operations, the block write signal BW is low and forces the NAND gate 256 to output a "1". If the enable write signal WRITEEN is high, the output of the NAND gate 258 will be a "0".

The output of the NAND gate 258 is input to a NOR gate 260 having as its remaining input a $\overline{\text{Q}}$ output of a mask register 262 to produce an enable signal EN that enables a differential write driver 264 in the IO interface 110. The enable signal EN can be seen to be a "1" only when the block write conditions described above are satisfied and when data from the mask register is "0" or in a standard write operation when the block write signal BW is a "0" and the enable write signal WRITEEN is a "1". Therefore, the differential write driver 264 is enabled only during standard write operations or when data from the mask register is a "0" and the block write conditions are satisfied, i.e., when addresses are masked during block write operations.

Data comes to the differential write driver 264 through a multiplexer 266 having one input driven by the second slave register 252 and a second input driven by the color register 254. Within the multiplexer 266, data from the second slave register 252 is multiplexed with data from the color register 254, such that if the block write signal BW is high, data from the color register 254 drives the differential write driver 264 and if the block write signal BW is low, data from the second slave register 252 drives the differential write driver 264. Within the IO interface 110, the differential write driver 264 develops signals on IO lines 268, 270 to write data to selected memory locations, as is conventional in standard write operations. Prior to signal development on the IO lines 268, 270, the precharge signal PRE activates a conventional precharge circuit 271 to precharge and equalize the IO lines 268, 270 to a high potential.

Because data is clocked through the slave register 252 by the master-slave write pass signal M-S WRITEPASS, it is important to consider the difference in timing of the master-slave write pass signal M-S WRITEPASS between two and three latency operation. As described above for the latency control circuit 136 of FIG. 6, in two latency operation, the master-slave write pass signal M-S WRITEPASS is produced in the two latency control section 140 very shortly after a leading edge of the clock signal CLK. Therefore, two latency operation data passes through the slave registers 250, 252 almost immediately after a leading edge of the clock signal CLK.

In three latency operation, development of the master-slave write pass signal M-S WRITEPASS is delayed in the three latency control section 142 by the delay block 212, as described above. In three latency operation, data is held for a selected period of time (approximately the delay τ of the signal delay block 212) in the slave registers 250, 252 prior to being passed to the differential write driver 264. At the differential write driver 264, the data is not written to the IO lines 268, 270 until the enable write signal WRITEEN goes high. Because the enable write signal WRITEEN is delayed in three latency operation, the data does not arrive at the IO interface 110 until more than one clock cycle after the corresponding write command. The write operation for three latency mode may thus be described as a two latency write.

As compared to conventional operation, the imposition of a write latency allows increased time between the arrival of data on the data bus 244 and the actual signal development in the IO lines 268, 270. This allows additional time for prewriting activity, such as precharging and address decoding. In block write operation, the write latency is particularly advantageous as it can allow sufficient time between a block write command and actual writing to establish a column mask even at high clock frequencies. As a consequence, a block write command at high clock frequencies does not require the next command to be a no operation command NO-OP. Instead, an operative command, such as a read command, write command, or even another block write command can immediately follow a block write command, as will be discussed below with respect to FIG. 11.

For read operations, the output data path 242, shown in the lower part of FIG. 8, transmits data from the IO interface 110 to the data bus 105. The output data path 242 is driven by a read amplifier 272 coupled to the IO lines 268, 270 and enabled by the latch helper flip-flop signal LHFF. When the latch helper flip flop signal LHFF goes high, if sufficient signal development has occurred on the IO lines 268, 270, the read amplifier 272 outputs a pair of differential logic signals to a pair of NAND gates 274. At other times, such as during the precharge period, the read amplifier 272 outputs a "1" on the NAND gates 274. The pair of NAND gates 274 are also enabled by the latch helper flip-flop signal LHFF. Then, the master output register 276 latches the data with cross-coupled NAND gates 277. The latched data is then forwarded with a pair of NAND gates 279 enabled by the master-slave read pass signal M-S READPASS.

The outputs of the NAND gates 279 are gated by a gate 278 controlled by the three latency signal 3LAT, such that data from the master output register 276 is passed only when the three latency signal 3LAT is high. The master output register 276 therefore provides a path to data only when the three latency signal 3LAT is high.

It is important to note that, during three latency operation, latched data from the cross coupled NAND gates 277 is only output when the master-slave pass signal M-S READPASS enables the NAND gates 279. As described above with respect to FIG. 6, the master-slave read pass signal M-S READPASS is delayed with respect to its corresponding read command by one clock cycle due to the delay imposed on the read signal READ at the register 236 caused by the three latency latch pulse $\overline{3LATPULSE}$. Therefore, in three latency operation, data from the memory array 101 is delayed in the NAND gates 279. Because the delay in the NAND gates 279 is controlled by the three latency latch pulse $\overline{3LATPULSE}$, the timing of the output data path 242 in the three latency operation is controlled by the latency control circuit 136.

Timing in the output data path for two latency operation is much simpler. In two latency operation, the three latency signal 3LAT will be low and the two latency signal 2LAT will be high. The high two latency signal 2LAT turns on a pair of bypass transistors 280 to bypass the master register 276, the NAND gates 279, and the gate 278. Because the data bypass the NAND gates 279 in two latency operation, no significant delay is imposed by the data output path 242 during two latency operation. Thus, the output data path 242 delays data only in three latency operation.

Regardless of whether two or three latency operation is selected, the outputs of the bypass transistors 280 or the outputs of the gate circuit 278 drive a data output register 282. The data output register 283 then drives an output driver 284 through a pair of output enable AND gates 286 to provide data to the data bus 105.

The above discussion separately describes the development and timing of each of the command signals READ, WRITE, BW, the control signals WRITEEN, LHFF, PRE, M-S, READPASS, M-S WRITEPASS, DECEN, and selected other signals in the multiple latency synchronous dynamic random access memory 100. However, examples of sequential commands are helpful to demonstrate the overall timing algorithms implemented by the latency control circuit 136 and by the data input and data output paths 240, 242. An example of sequential commands in three latency operation will be presented first.

Figure 9:
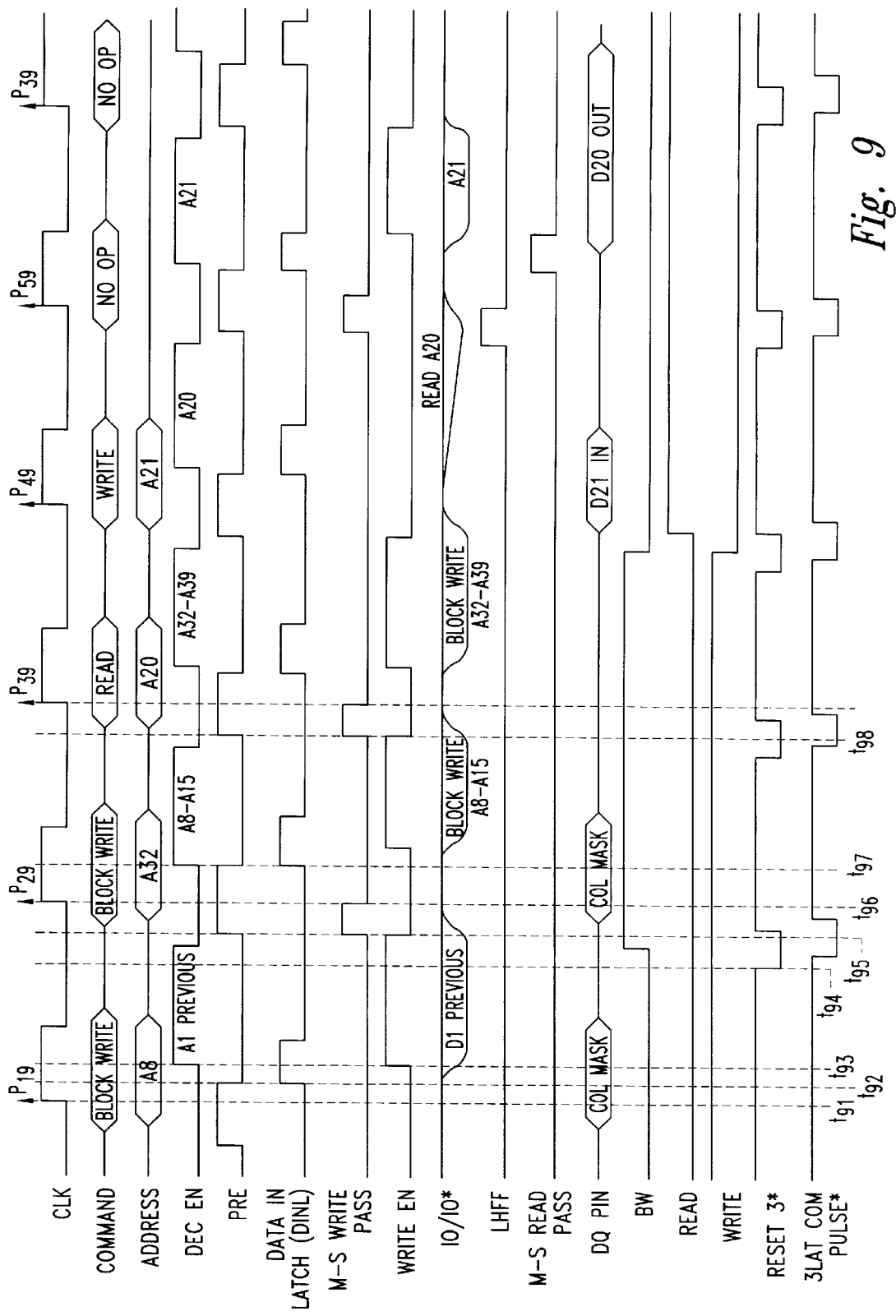
FIG. 9 is a signal timing diagram showing signals within the multiple latency synchronous dynamic random access memory of FIG. 1 in response to a sequence of commands for three latency operation.

As shown in FIG. 9 for three latency operation, two block write commands are followed by a read command, followed in turn by a write command. At a first leading edge $P_{19}$, the first block write command arrives at the logic controller 102. As discussed above, the block write command is actually a combination of signals including the chip select signal $\overline{CS}$, the row address signal $\overline{RAS}$, the column address select signal $\overline{CAS}$, the write enable signal $\overline{WE}$ and the block write select signal DSF. At the same leading edge $P_{19}$, the address A8 is provided from the address bus 106 and column mask data is provided at the data bus 105 (FIG. 1). While the column mask data is available on the data bus 105 and the block write command and address A8 are still available, the leading edge detector 248 (FIG. 6) produces the data in latch signal DINL at time $t_{92}$. The data in latch signal DINL drives the master register 246 (FIG. 8) to clock the column mask data through the master register 246 to the slave registers 250, 252.

At about the same time that the data in latch signal DINL goes high, the precharge signal PRE from the tristate inverter 224 (FIG. 6) goes low. Very shortly thereafter, at a time $t_{93}$, the enable write signal WRITEEN from the tristate inverter 228 (FIG. 6) goes high in response to the leading edge $P_{19}$. Note that the enable write signal WRITEEN in response to the leading edge $P_{19}$ results from a previous write command corresponding to the address A1 PREVIOUS (not shown). The enable write signal WRITEEN at the time $t_{93}$ does not result from the block write command at the leading edge $P_{19}$. When the enable write signal WRITEEN is high, the differential write driver 264 (FIG. 8) writes the data D1 PREVIOUS to the IO lines 268, 270. While the data D1 PREVIOUS is being written to the IO lines 268, 270, the column mask for the block write is developed and the block write command and address A8 are decoded.

At a later time $t_{94}$, the reset signal $\overline{RESET3}$ is produced by the signal delay block 212 (FIG. 6) and is followed shortly thereafter by the three latency latch pulse $\overline{3LATPULSE}$. The three latency latch pulse $\overline{3LATPULSE}$ clocks the interim block write signal BW' through the register 238 to produce the block write signal BW. At approximately the same time, the tristate inverter 218 produces the master-slave write pass signal M-S WRITEPASS in response to the reset signal $\overline{RESET3}$. The master-slave write pass signal M-S WRITEPASS clocks data from the master register 246 (FIG. 8) through the slave registers 250, 252. Also at approximately the same time, the enable write signal WRITEEN from the tristate inverter 228 (FIG. 6) goes low, ending the writing of data on the IO lines 258, 270 (FIG. 8). The decode enable signal DECEN also goes low, ending the provision of the decoded previous address A1 PREVIOUS to the memory array 101 (FIG. 1). Finally, the precharge signal PRE returns high at the time $t_{95}$ to begin precharging the IO lines 268, 270 (FIG. 8) for the next operation. While the precharge signal PRE is still high, the master-slave write pass signal M-S WRITEPASS returns low.

At the next leading edge $P_{29}$, a second block write command, a second address A32 and a second column mask arrive. The data from the second column mask is latched into the master register 246 by the data in latch signal DINL at a time $t_{97}$. The precharge signal PRE also goes low at the time $t_{97}$, ending the precharge period for the first block write. Almost immediately thereafter, the decode enable signal DECEN goes high and writing is enabled by the enable write signal WRITEEN, initiating the actual block writing of the first block of addresses A8–A15. Block write signal development differs from the conventional write operations in that 8 columns are simultaneously accessed for writing via the column decoder 134, rather than just one. Also, the column mask inhibits writing to selected ones of the eight addresses A8–A15 by disabling writing to selected columns by disabling corresponding differential write drivers 264.

Shortly before the next leading edge $P_{39}$ at a time $t_{98}$, signal development for the first block write ends as the differential write driver 264 (FIG. 8) is disabled by the enable write signal WRITEEN going low. The first block write is now complete.

During the first block write, the prewriting operations for the second block write operation, such as establishing the column mask and latching data into the master register 246, are completed. The sequence of signals is then repeated for the second block write operation as described above for the first block write signal except that data is written to addresses A32–A39 as determined by the column decoder 134 (FIG. 1).

It is instructive to note that the first block write command and the address A8 arrive at the first leading edge $P_{19}$ while the block write to the addresses A8–A15 is completed shortly before a third leading edge $P_{39}$. Thus, the block write operation can be said to be performed with a write latency of two. Because the actual writing of data to the block addresses A8–A15 does not begin until approximately one clock cycle after the column mask data is clocked into the master register 246 (FIG. 8) by the data in latch signal DINL, the information necessary for creating the column mask is available well in advance of the actual need for the column mask for block writing. Consequently, the logic controller 102 (FIG. 1) can utilize the write latency period to develop the column mask and put the column mask in place prior to the beginning writing to the addresses A8–A15. The multiple latency synchronous dynamic random access memory 100 can therefore perform the block write operation at a high clock frequency without requiring a no operation command NO-OP immediately following the block write command. Note that, as shown in FIG. 9 to the right of the second block write command at the second leading edge $P_{29}$, a block write command can also be followed immediately by a read command.

Figure 10:
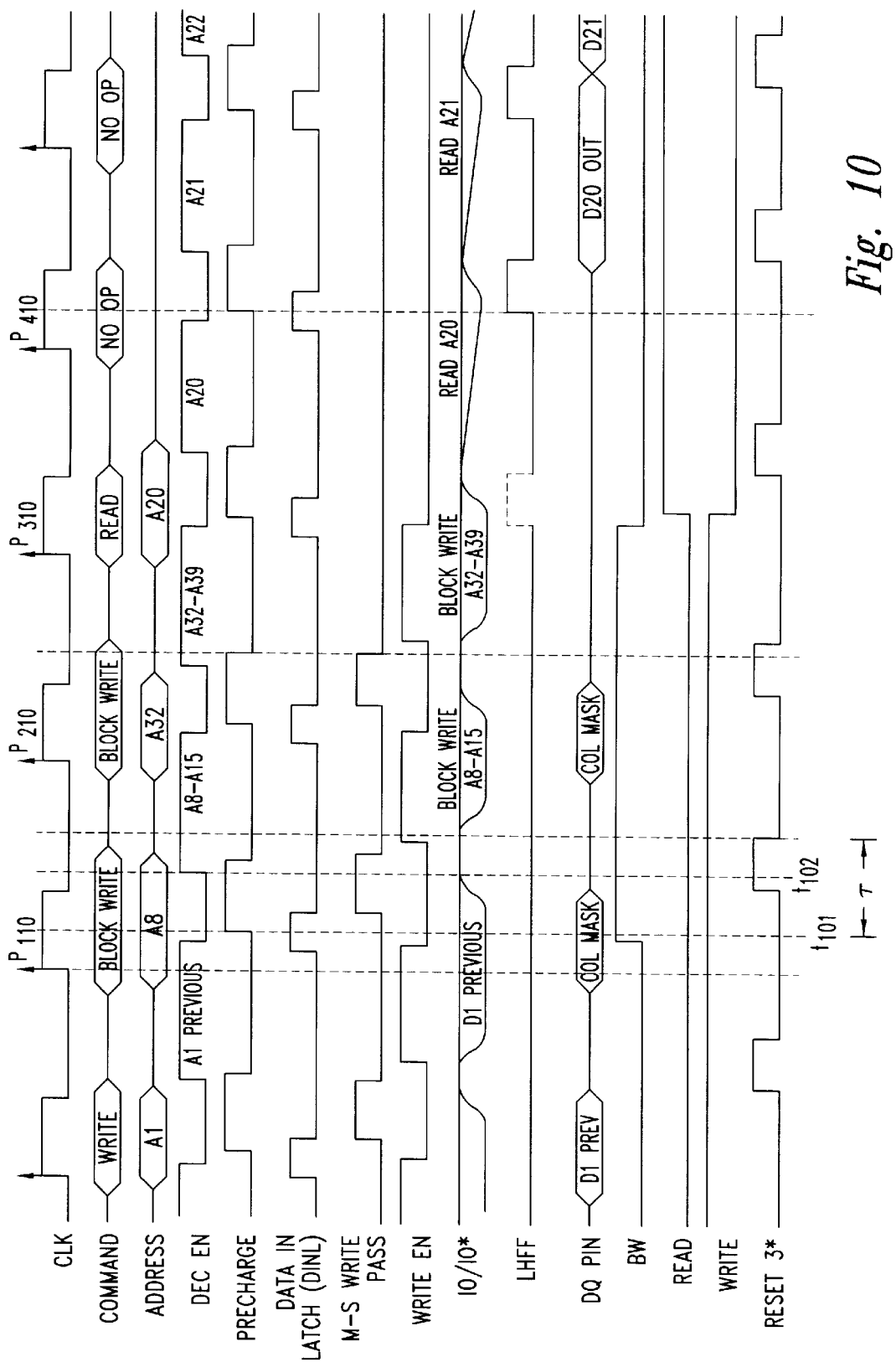
FIG. 10 is a signal timing diagram showing signals within the multiple latency synchronous dynamic random access memory of FIG. 1 in response to a sequence of commands for two latency operation.

A comparison to two latency operations for a similar sequence of commands highlights the timing differences between two and three latency operation. FIG. 10 shows a typical two latency timing sequence within the multiple latency synchronous dynamic random access memory 100 where a write command is followed by two block write commands and read command. The two block write commands and the read command correspond to the block write and read commands of FIG. 9. The write command corresponds to the previous write command for which only a portion of the signals were shown in FIG. 9. As can be seen in FIG. 10, at the leading edge $P_{110}$ when the block write command and the address A8 arrive, the previous data D1 PREVIOUS is being written to the IO lines 268, 270 (FIG. 8). The precharge signal PRE goes high simultaneously with the enable write signal WRITEEN going low to end writing of the previous data D1 PREVIOUS. Note that, at a time $t_{101}$, the precharge signal PRE goes high before the address A8 exits the address bus and before the block write command is complete. As soon as the writing of the previous data D1 PREVIOUS is complete at a time $t_{102}$, the addresses A8–A15 corresponding to the block write command are made available by the address decoder 134 (FIG. 1) in response to the decode enable signal DECEN. Because the writing of data to the addresses A8–A15 requires that the column mask be in place, the time T between the latching of the column mask into the mask register 262 (FIG. 8) and the beginning of the signal development for the addresses A8–A15 must be sufficient to allow the column mask to be set up. Consequently, for successive block writes, the period of the clock signal CLK must be sufficiently long that column mask data can be latched, the column mask can be set up and signals can be developed. Otherwise, a new column mask will arrive before the signal development is complete. Note that this problem is alleviated in three latency operation because writing to the addresses A8–A15 does not begin for more than one clock cycle after the arrival of the column mask and the column mask is put in place over more than one clock cycle.

The second block write operation begins with a second block write command at the next leading edge $P_{210}$. When the address A32 for the second block write command arrives at the address bus 105, the signal development for the first block write is still ongoing. Before the address A32 is off of the address bus 105 (FIG. 8), precharging of the IO lines 268, 270 begins. Almost immediately after precharging ends, signal development at the addresses A32–A39 begins. Meanwhile, a read command and address A20 arrive at the multiple latency synchronous dynamic random access memory 100. The resulting read operation is identical to that described previously with respect to FIG. 5.

From the foregoing it will be appreciated that, although embodiments of the invention have been described herein for purposes of illustration, various modifications may be made without deviating from the spirit and scope of the invention. For example, a write latency of two has been described, although other write latencies may be used within the scope of the invention. Similarly, the command may be modified to conform to various applications, such as video or other types of DRAM. Accordingly, the invention is not limited except as by the appended claims.

What is claimed is:

1. A synchronous dynamic random access memory integrated circuit responsive to a clock signal, comprising:

a latency select circuit coupled to receive a first signal and producing a first latency select signal in response to the first signal;

a plurality of latency circuits each coupled to receive the clock signal, commands and the first latency select signal, a first of the plurality of latency circuits producing a first set of control signals in response to the commands, the clock signal and the first latency select signal;

a memory array;

a data bus for providing data to and receiving data from the memory array; and an interface circuit coupled between the memory array and the data bus, the interface circuit further being coupled to receive the first set of control signals, the interface circuit controlling transfer of data between the data bus and the memory array in response to the received set of control signals.

2. The synchronous dynamic random access memory integrated circuit of claim 1 wherein the latency select circuit produces a second latency select signal in response to a second signal, the memory integrated circuit further comprising a second of the plurality of latency circuits, the second latency circuit producing a second set of latency control signals in response to the commands, the clock signal and the second latency select signal, wherein the interface circuit is further coupled to receive the second set of control signals.

3. The synchronous dynamic random access memory integrated circuit of claim 2 wherein the first latency circuit includes a first timing circuit establishing a first set of signal times for the first set of control signals and wherein the second latency circuit includes a second timing circuit establishing a second set of signal times for the second set of control signals.

4. The synchronous dynamic random access memory integrated circuit of claim 2 wherein the first latency circuit includes a first timing circuit providing a first set of signal times for the first set of control signals and wherein the second latency circuit includes a second timing circuit providing a second set of signal times for the second set of control signals.

5. The synchronous dynamic random access memory integrated circuit of claim 4 wherein the second timing circuit includes:
a write timing circuit providing write delay times in response to a write delay signal; and
a read timing circuit providing read delay times in response to a read delay signal.

6. A synchronous dynamic random access memory integrated circuit comprising:
an array of memory cells;
a latency select circuit coupled to receive a control signal and producing a selected latency signal in response to the received control signal;
a data bus; and
a data input circuit coupled to receive the control signal and the selected latency signal, the data input circuit further being coupled between the data bus and the memory array to transfer data between the data bus and the memory array, the data input circuit imposing a first delay on the transfer of data from the data bus to the memory array in response to the selected latency signal.

7. The synchronous dynamic random access memory integrated circuit of claim 6 wherein the latency select circuit produces another selected latency signal in response to another received control signal and the data input circuit imposes a second delay on the transfer of data from the data bus to the memory array in response to the another selected latency signal.

8. The synchronous dynamic random access memory integrated circuit of claim 6 wherein the data input circuit includes a master register coupled to receive data from the data bus and a first slave register coupled to receive data from the master register.

9. The synchronous dynamic random access memory integrated circuit of claim 8 wherein the master register includes a transfer input connected to receive the control signal, the master register transmitting data to the first slave register in response to the received control signal.

10. The synchronous dynamic random access memory integrated circuit of claim 6, further including a data output circuit, wherein the data output circuit includes a first transfer path coupled between the data bus and the memory array, a second transfer path coupled between the data bus and the memory array, and a selector circuit coupled to receive the selected latency signal, the selector circuit further being connected to enable one or the other of the first and second transfer paths in response to the received selected latency signal.

11. The synchronous dynamic random access memory integrated circuit of claim 10 wherein the first transfer path includes a data register having a transfer input connected to receive the control signal, the register accepting and outputting data in response to the received control signal.

12. The synchronous dynamic random access memory integrated circuit of claim 11 wherein the second transfer path includes a bypass circuit connected to bypass the data register.

13. An apparatus for precharging a column of a memory array in a synchronous dynamic random access memory (DRAM), comprising:
means for selecting between multiple latency modes for the DRAM, the selecting means providing a latency mode signal;
means, coupled to the selecting means, for enabling access to the column in response to a first leading edge of a clock signal when a first latency mode is selected;
means, coupled to the enabling means, for determining a first access time when the first latency mode is selected; and
means, coupled to the selecting, enabling and determining means, for ending access to the column at the end of the determined access time when the first latency mode is selected.

14. The apparatus of claim 13, further comprising:
means, coupled to the selecting means and the enabling means, for inhibiting access to the column in response to the first leading edge for a precharge period when a second latency mode is selected; and
means, coupled to the selecting means and the enabling means, for allowing access to the column after the precharge period until a second leading clock signal edge, immediately following the first leading edge.

15. The apparatus of claim 13 wherein the determining means comprises:
a latch that is set in response to the first leading edge;
a delay circuit for producing a reset signal by delaying an output of the latch; and
a reset input to the latch for resetting the latch with the reset signal.

16. The apparatus of claim 14 wherein the inhibiting means comprises a write driver coupled to the column where the write driver is disabled in response to the first leading edge.

17. The apparatus of claim 13 wherein the selecting means comprises a latency select circuit coupled to receive a first signal and producing a first latency select signal in response to the first signal.

18. The apparatus of claim 17 wherein the determining means comprises a plurality of latency circuits each coupled to receive the clock signal, commands and the first latency select signal, a first of the plurality of latency circuits producing a first set of control signals in response to the commands, the clock signal and the first latency select signal.

19. The apparatus of claim 18 wherein the selecting means further comprises a latency select circuit coupled to receive a second signal and producing a second latency select signal in response to the selected signal.

20. The apparatus of claim 19 wherein the determining means comprises a second of the plurality of latency circuits producing a second set of control signals in response to the commands, the clock signal and the second latency select signal.

* * * * *